United States Patent [19]
Greschner et al.

[11] Patent Number: 4,556,628
[45] Date of Patent: Dec. 3, 1985

[54] PROCESS FOR PRODUCING PRINTED CIRCUIT BOARDS WITH METALLIC CONDUCTOR STRUCTURES EMBEDDED IN THE INSULATING SUBSTRATE

[75] Inventors: Johann Greschner, Pliezhausen; Friedrich W. Schwerdt, Herrenberg; Hans J. Trumpp, Stuttgart, all of Fed. Rep. of Germany

[73] Assignee: International Business Machines Corporation, Armonk, N.Y.

[21] Appl. No.: 600,063

[22] Filed: Apr. 13, 1984

[30] Foreign Application Priority Data

May 19, 1983 [EP]  European Pat. Off. ........ 83104956.4

[51] Int. Cl.<sup>4</sup> ............................................. G03C 5/00
[52] U.S. Cl. ..................................... 430/314; 430/315; 430/316; 430/317; 430/319; 430/329; 156/643
[58] Field of Search ............... 430/313, 314, 315, 319, 430/317, 312, 316, 329; 204/15; 156/643

[56] References Cited

U.S. PATENT DOCUMENTS 3,424,658  1/1969  Norton ................................. 204/15
3,434,939  3/1969  Mickelson et al. ................. 204/15
3,849,136  11/1974  Grebe .................................. 430/314
4,054,483  10/1977  Peiffer ................................. 156/632
4,218,532  8/1980  Dunkleberger ..................... 430/314
4,388,351  6/1983  Sawyer ................................ 427/304
4,463,084  7/1984  Mitsumori et al. ................. 430/315
4,497,684  2/1985  Sebasta ................................ 156/643
4,508,815  4/1985  Ackmann et al. ................... 430/314

FOREIGN PATENT DOCUMENTS 1426629  3/1976  United Kingdom .

Primary Examiner—J. E. Kittle
Assistant Examiner—José G. Dees
Attorney, Agent, or Firm—Jesse L. Abzug; Steven J. Meyers; Max J. Kenemore

[57] ABSTRACT

A process for producing printed circuit boards having metallic conductor structures embedded in the insulating substrate and whose front and back sides are conductively connected by means of plated through holes. The first steps of the process comprise producing a matrix on an epoxy resin substrate consisting of a lift-off layer, an aluminum barrier layer and a positive photoresist layer. A negative image of the desired conductor pattern is then generated in the photoresist layer using conventional photolithographic techniques. The negative image is etched into the barrier layer and the lift-off layer such that an undercut occurs under the barrier layer. Subsequently, vertical trenches are etched into the epoxy resin substrate. After drilling of the through holes, an activating layer of copper is deposited by means of magnetic field enhanced cathode sputtering on the surfaces of the trenches, the through holes and the barrier layer. The lift-off layer, together with the barrier layer covering it, is removed by immersion in a suitable solvent, and copper conductors are subsequently grown in the etched conductor trenches.

8 Claims, 4 Drawing Figures

PROCESS FOR PRODUCING PRINTED CIRCUIT BOARDS WITH METALLIC CONDUCTOR STRUCTURES EMBEDDED IN THE INSULATING SUBSTRATE

BACKGROUND OF THE INVENTION

1. Field of the Invention

This invention relates to a process for producing printed circuit boards.

2. Description of the Prior Art

Conventional methods of printed circuit board manufacturing consist of essentially two techniques: the subtractive method and the additive method. In the subtractive method a substrate having a relatively thick copper laminate is photoresist coated and exposed through a mask according to the desired conductor configuration. After exposure, the photoresist is removed from the unexposed areas and then the circuit board is etched, removing the copper from the area not covered by the photoresist. The remaining resist is subsequently removed by means of a solvent, so that only the printed circuit remains on the insulating substrate.

This subtractive method has the disadvantage that a relatively thick copper laminate is applied and then most of this laminate has to be removed by etching. As a result, this method is uneconomical, as much of the copper is wasted. Additionally, the geometry of the conductor structure is limited because the etchant is capable of undercutting the desired copper conductors as well as removing the unwanted copper.

In the additive method, a thin copper foil of about 5 microns thickness is laminated to an insulating substrate. Subsequently, a photoresist film is laminated to the copper foil and exposed and developed as in the subtractive process. The photoresist film is then removed from those areas where the copper conductors are to be generated and in an electroless copper bath, additional copper is deposited on the bared copper conductors. The photoresist mask is then removed.

The common features of the subtractive and additive processes are: (1) they both use negative photoresists which are applied either as a liquid or as a resist foil, and (2) they both result in a conductor structure that is raised above the level of the insulating substrate.

It is desirable, however, to utilize positive photoresist where possible, and under some circumstances, it is also desirable to have a conductor structure that is embedded in the insulating substrate and less vulnerable to environmental factors, such as rubbing, scratching, etc.

A process is known for producing circuit boards with planar conductor structures embedded therein, but this prior art process is a subtractive one using negative photoresist materials.

Therefore, it is the object of this invention to provide an improved process for producing printed circuit boards having conductor structures embedded in an insulating substrate wherein positive photoresist materials are advantageously used and a planar surface is obtained.

It is a further object of the invention to provide a process wherein conductor structures are present on both the front and back sides of a insulating substrate and plated through holes connect the two conductor structures.

SUMMARY OF THE INVENTION

These objects are accomplished according to the following method:

(1) Producing a matrix on an epoxy resin substrate comprising a lift-off layer, an aluminum barrier layer and a photoresist layer;
(2) Generating a negative image of the desired conductor pattern in the photoresist layer;
(3) Etching the negative image into the barrier layer and the lift-off layer;
(4) Etching vertical trenches into the epoxy resin substrate;
(5) Drilling the through holes;
(6) Sputtering the copper activating layer on the surfaces of the trenches, through holes, and barrier layer;
(7) Removing the lift-off layer and barrier layer; and
(8) Growing copper conductors in the etched trenches.

DESCRIPTION OF THE PREFERRED EMBODIMENT

Figure 1:
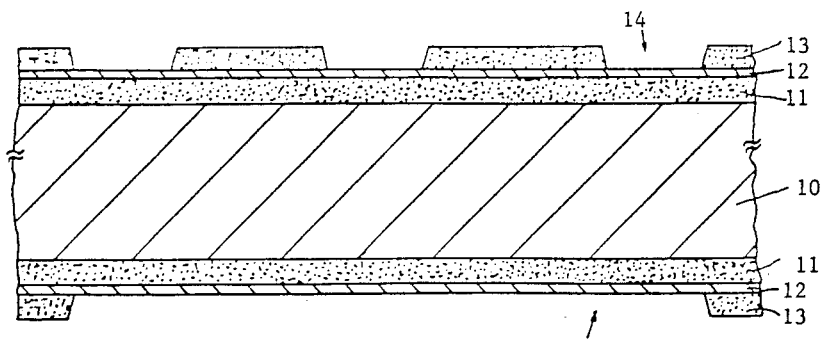
FIG. 1 is a cross-sectional view of a printed circuit board after deposition of the matrix layers and exposure and development of the photoresist layer.

The inventive process will be described in detail below with reference to the drawing in which the four figures show schematically the production sequence.

Referring to FIG. 1, an epoxy resin impregnated glass fabric is used as the substrate 10. On the surface of the substrate 10, a matrix is deposited on both sides consisting of a lift-off layer 11, a barrier layer 12, and a photoresist layer 13.

The lift-off layers 11, in the preferred embodiment, comprise layers of positive photoresist material. Positive photoresist materials suitable for this purpose are available under the tradename Shipley AZ 1350J which contains phenol formaldehyde resin with 3, 4-dihydroxy-benzophenone-4-[napthoquinone-1,2-diazide-2-] sulfonate as a reactive constituent or Shipley AZ 111 comprising carboxylmethyl ethers of formaldehyde resins with o-quinone diazide as a reactive constituent. Coating of the substrate 10 is best accomplished by immersing it perpendicularly in a diluted solution of photoresist and by subsequently removing it at a defined rate, yielding layer thicknesses ranging from 2–4 microns. The lift-off layers 11 are then dried in a circulating air oven at about 80°–100° C. for 20 minutes.

In the next step, barrier layers 12, which preferably consist of a metal that is easy to cold-sputter or evaporate, are applied. Aluminum, as an example, is evaporated with a layer thickness of about 200–500 nm in an evaporation system with an electron beam gun in about 200 seconds. The aluminum layers 12 are then coated with positive photoresist layers 13, using the above-described photoresist. This time, however, undiluted photoresist is applied in an immersion step with layer thicknesses of about 3-4 microns and, as previously described, dried in a circulating oven at 80°-100° C. for 20 minutes. Additionally, it is possible to substitute positive resist laminating foils in lieu of the liquid positive resist materials. The matrix structure is now complete.

The conductor structures desired are defined on the exterior surfaces of the photoresist layers 13 using known photolithographic techniques. As positive photoresist materials are used, the mask is transparent only in a few areas where conductors are to be generated. The imaged photoresist layers 13 are developed in an immersion step, using an aqueous alkaline developer comprising $Na_2SiO_3$, $Na_3PO_4$ and NaOH, at a temperature approximately 24° C. In practice, the development time must be determined by testing, as it depends greatly on the exposure parameters. As a result of these steps, the photoresist layers 13 now have patterns 14 corresponding to the desired conductor structures.

Figure 2:
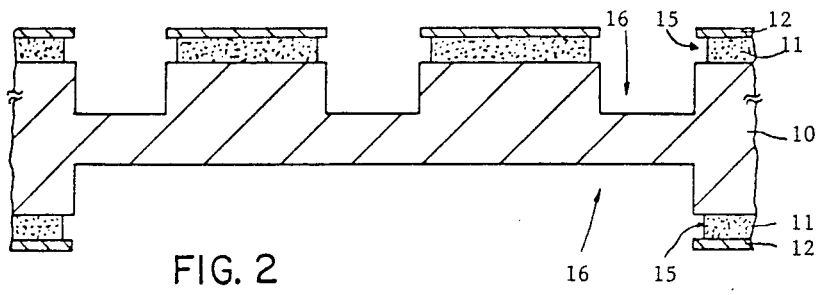
FIG. 2 is a cross-sectional view of a printed circuit board following etching of the mask image into the barrier layer, lift-off layer, and the insulating substrate.

Etching the aluminum barrier layers 12 (FIG. 2) through the photoresist layers 13, can be accomplished using one of two processes. The aluminum may be etched in a wet chemical process, using a commercial etchant containing $H_3PO_4$, $HNO_3$, and $H_2O$ in a ratio of 80:160:4, an etch rate of 3-3.5 nm per second and a temperature of 40° C. The etch end point is preferably detected by means of laser interferometry.

Alternatively, the aluminum barrier layers 12 may be etched in a dry etch process, using a reactor with plate electrodes arranged in parallel and halogenated etch gases, such as $CCl_4$, $CCl_2F_2$, $CBrF_3$, or $CFCl_3$ each mixed with 10-20% oxygen. Equally satisfactory results are obtained with a mixture of 7.5% by volume $SF_6$, 2.5% by volume $Cl_2$ and 90% by volume helium. The etch parameters must be adjusted so that the etch rate ratio between the photoresist layers 13 and barrier layers 12 is as high as possible. The following etch parameters have been used when the invention was reduced to practice:
Energy Density: 0.2 watt/cm$^2$.
Partial Pressure: 12-40 μbar.
Flow: 20-40 cm$^3$/min.
Etch Rate Ratio: 1:2 to 1:4.
Etch Rate Aluminum: 100 nm/min.

In this case, too, the etch end point is advantageously detected by laser interferometric thickness measurement. After the aluminum barrier layers 12 have been etched through in the dry etch process, oxygen is used as an etch gas, and the photoresist lift-off layers 11 are reactively etched so that an undercut 15 is obtained as a function of the etch pressure. The following parameters have been used for the reactive ion etching of lift-off layers 11:
Energy Density: 0.2 watt/cm$^2$.
Oxygen Flow: 30 cm$^3$/min.
Pressure: 100-200 μbar.
Etch Rate: 200 nm/min.

Subsequently, trenches 16 are vertically etched with oxygen as the etch gas into the epoxy resin substrate 10 through the aperture defined by the aluminum barrier layer 12. The trench depth of about 40 μm correspondends to the future conductor thickness. The trenches 16 in the substrate 10 may be reactively etched, using the following parameters:
Energy Density: 0.2 watt/cm$^2$.
Flow: 200 cm$^3$/min.
Pressure: 6 μbar.
Etch Rate: 120 nm/min.

Figure 3:
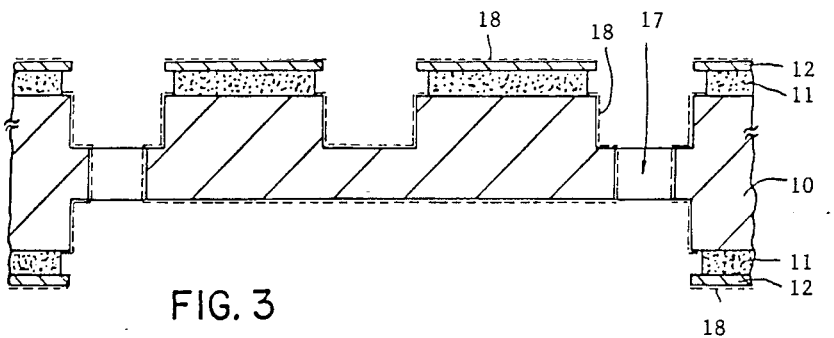
FIG. 3 is a cross-sectional view of a printed circuit board following drilling of the through holes and sputtering of the copper seed layer.

According to the conductor pattern desired, holes 17 (FIG. 3) are then drilled into the substrate to connect the front and back sides. Subsequently, a thin copper seed layer 18 is deposited on the surfaces of the trenches 16 etched in the substrate 10 and the holes 17, as well as on the surface of the aluminum barrier layer 12. A continuously fed high-energy cathode sputter system with two facing copper cathodes is used. Copper layers are sputtered with a layer thickness between 200 and 1,000 nm, preferably between 400 and 600 nm. The undercut 15 (see FIG. 2) generated in the lift-off layer 11 prevents the walls of the lift-off layer from being sputtered with copper when the copper seed layer 18 is deposited.

In the next process step, the photoresist lift-off layers 11 and the aluminum barrier layers 12 are removed by immersion in a suitable solvent, such as acetone or N-butyl acetate. This yields an epoxy substrate 10 with etched conductor trenches 16 whose walls are sputtered with copper 18. The substrate 10 is ready for copper-plating in the etched trenches. A copper plating bath with the following parameters has been advantageously used:
pH Value: 12.6 set with NaOH.
$CuSO_4 \times 5H_2O$: 10.5 g/l highly pure copper salt ($<7$ ppm Fe).
HCHO (37%): 3.5 ml/l as a reducing agent.
NaCN: 26.0 mg/l as a ductility aid.
EDTA: 17.5 g/l as a complexing agent.
Temp.: 53°±1° C.

Figure 4:
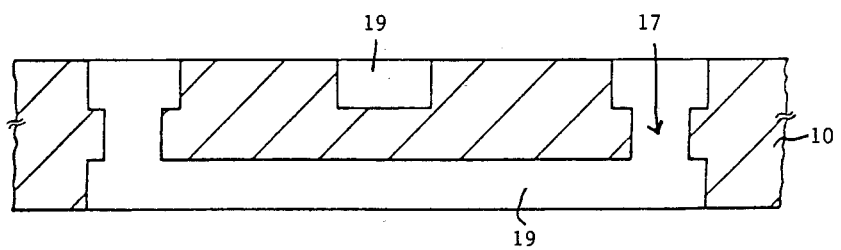
FIG. 4 is a cross-sectional view of a printed circuit board with conductors embedded in the insulating substrate.

The conductors are simultaneously grown from all sides of the trenches until the trenches are completely filled with copper (FIG. 4). The deposited conductors 19 have a layer thickness ranging from 35-50 μm. Conductors with a thickness of 40 μm, for example, are deposited in about 20 hours. During this process, the through holes 17 which conductively connect the conductors on the front and back sides of the substrate are also copper plated. Any undesired copper deposited on the remaining substrate surface is removed by an intensive etch process.

With the method as disclosed by the invention, printed circuit boards with conductors embedded in the front and back sides can be fabricated using positive photoresist materials.

While the invention has been particularly shown and described with reference to a preferred embodiment thereof, it will be understood by those skilled in the art that various changes in detail may be made therein without departing from the spirit, scope and teaching of the invention. Accordingly, the process herein disclosed is to be considered merely as illustrative, and the invention is to be limited only as specified in the claims.

We claim:

1. A process for fabricating printed circuit boards having metallic conductor structures embedded in the front and back sides of an insulating substrate, said front and back sides being conductively connected by means of plated through holes, comprising the following process steps:
   depositing a lift-off layer on the substrate and drying;
   evaporating a metallic barrier layer on said lift-off layer and drying;
   depositing any type of positive photoresist layer on said barrier layer and drying;
   exposing said photoresist layer through an image mask;
   developing said exposed photoresist layer to produce a negative mask image;

etching said mask image into said barrier layer;
etching said mask image into said lift-off layer;
vertically etching trenches into said substrate;
drilling through holes for connecting conductor structures on said first and second sides;
depositing a thin copper seed layer on the surfaces of said trenches, said through holes and said barrier layer;
removing said lift-off layer together with said barrier layer; and
depositing copper in said trenches and said through holes to a depth of at least 35 micrometers.

2. The process as claimed in claim 1, wherein said lift-off layer comprises positive photoresist materials.

3. The process as claimed in claim 1, wherein said barrier layer is dry-etched by means of a halogenated etch gas.

4. The process as claimed in claim 1, wherein said lift-off layer is dry-etched such that an undercut occurs in said lift-off layer.

5. The process as claimed in claim 1, wherein said barrier layer is an aluminum layer with a thickness of 200 to 500 nm.

6. The process as claimed in claim 5, wherein said barrier layer is dry-etched by means of a halogenated etch gas.

7. The process as claimed in any one of claims 1 to 6, wherein said thin copper seed layer is sputtered with a layer thickness between 200 and 1000 nm.

8. The process as claimed in claim 7, wherein the thickness of said copper deposits in said trenches are in the range of approximately 35 micrometers to approximately 50 micrometers.

* * * * *